(12) United States Patent
Wang (10) Patent No.: US 9,305,498 B2
(45) Date of Patent: Apr. 5, 2016

(54) GATE DRIVING CIRCUIT, GATE DRIVING METHOD AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Shijun Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/492,897

(22) Filed: Sep. 22, 2014

(65) Prior Publication Data

US 2015/0325181 A1 Nov. 12, 2015

(30) Foreign Application Priority Data

May 8, 2014 (CN) .......................... 2014 1 0193283

(51) Int. Cl.
  *G09G 3/36* (2006.01)
  *H03K 17/687* (2006.01)
  *G11C 19/28* (2006.01)

(52) U.S. Cl.
  CPC *G09G 3/36* (2013.01); *G11C 19/28* (2013.01); *G09G 2300/0465* (2013.01); *G09G 2310/0205* (2013.01); *G09G 2310/0286* (2013.01)

(58) Field of Classification Search
  USPC ................. 327/108–109, 407–408, 434, 487; 345/84, 87, 98–100
  See application file for complete search history.

(56) References Cited

U.S. PATENT DOCUMENTS 8,325,126 B2 * 12/2012 Cheng .................. G09G 3/3611
                                                  345/95
9,142,154 B2 *  9/2015 Kuo ....................... G09G 3/344
2010/0001929 A1  1/2010 Kawabe

FOREIGN PATENT DOCUMENTS

| CN | 1877668 A | 12/2006 |
| CN | 202210402 U | 5/2012 |
| CN | 102881248 A | 1/2013 |
| CN | 103000121 A | 3/2013 |

OTHER PUBLICATIONS

First Office Action regarding Chinese application No. 201410193283.6, dated Dec. 4, 2015. Translation provided by Dragon Intellectual Property Law Firm.

* cited by examiner

*Primary Examiner* — An Luu
(74) *Attorney, Agent, or Firm* — Harness, Dickey & Pierce, P.L.C.

(57) ABSTRACT

The present disclosure discloses a gate driving circuit, a gate driving method and a display device. The gate driving circuit includes a plurality of cascaded shift register units for outputting gate driving signals, each of the gate driving signals being output by a gate driving signal output terminal of each shift register unit; the gate driving circuit further includes: a gate driving control unit connected with the shift register unit for controlling the gate driving signal to be transmitted to N rows of pixel circuits time-divisionally, wherein N is a positive integer greater than or equal to 2.

20 Claims, 3 Drawing Sheets

GATE DRIVING CIRCUIT, GATE DRIVING METHOD AND DISPLAY DEVICE

CROSS-REFERENCE TO RELATED APPLICATION

The present disclosure claims the priority right of Chinese patent application No. 201410193283.6 filed on May 8, 2014, the whole content of which is incorporated herein for reference.

TECHNICAL FIELD

The present disclosure relates to the display technology field, and in particular, to a gate driving circuit, a gate driving method and a display device.

BACKGROUND

As the resolution of a liquid crystal display panel is becoming higher and higher, PPI (Pixels per inch) also gets higher and higher. Narrow bezel is required for a liquid crystal display panel of high PPI, therefore, all current liquid crystal display panels of high PPI adopt the LTPS (Low Temperature Poly-silicon) technology. How to realize the narrow bezel of liquid crystal display panels of high PPI adopting a-Si technology is a problem currently to be solved urgently.

SUMMARY

The main purpose of the present disclosure is to provide a gate driving circuit, a gate driving method and a display device, so as to enable the display device of high PPI to realize a narrow bezel.

In order to achieve the above purpose, the present disclosure provides a gate driving circuit, comprising a plurality of cascaded shift register units for outputting gate driving signals, each of the gate driving signals being output by a gate driving signal output terminal of each of the shift register units; the gate driving circuit further includes:

a gate driving control unit, connected with the shift register unit and configured to control the gate driving signal to be transmitted to N rows of pixel circuits time-divisionally, wherein N is a positive integer greater than or equal to 2.

When implemented, the gate driving control unit includes:
N control switches respectively connected between the gate driving signal output terminal and the N rows of pixel circuits;

wherein the gate driving signal is controlled to be transmitted to the N rows of pixel circuits time-divisionally through respectively accessing switch signals of the N control switches.

When implemented, the gate driving control unit includes N control transistors, each of which includes a gate electrode, a first electrode and a second electrode;

wherein a $i^{th}$ control transistor has a first electrode accessing the gate driving signal, a gate electrode accessing a $i^{th}$ switch signal, and a second electrode being connected with a $j^{th}$ row of pixel circuits;

a $i+1^{th}$ control transistor has a first electrode accessing the gate driving signal, a gate electrode accessing a $i+1^{th}$ switch signal, and a second electrode being connected with a $j+1^{th}$ row of pixel circuits;

wherein, the $i^{th}$ switch signal and the $i+1^{th}$ switch signal are clock signals, there is a difference of 360/N° between a phase of the $i^{th}$ switch signal and a phase of the $i+1^{th}$ switch signal, a clock period of the $i^{th}$ switch signal is equal to a valid time of the gate driving signal, and a clock period of the $i+1^{th}$ switch signal is equal to the valid time of the gate driving signal;

a sum of time during which the N control transistors are turned on within one clock period is equal to the valid time of the gate driving signal;

i is a positive integer, and $1 \le i \le N-1$, j is a positive integer, and $1 \le M-1$, M is a total number of rows of the pixel circuits.

When implemented, the gate driving control unit includes:
a first control transistor, wherein a first electrode of the first control transistor accesses the gate driving signal, a gate electrode of the first control transistor accesses a first switch signal, and a second electrode of the first control transistor is connected with the $j^{th}$ row of pixel circuits; and a second control transistor, wherein a first electrode of the second control transistor accesses the gate driving signal, a gate electrode of the second control transistor accesses a second switch signal, and a second electrode of the second control transistor is connected with the $j+1^{th}$ row of pixel circuits;

the first switch signal and the second switch signal are clock signals, a phase of the first switch signal is opposite to a phase of the second switch signal, and a clock period of the first switch signal and a clock period of the second switch signal are both equal to the valid time of the gate driving signal;

a sum of time during which the first switch signal controls the first control transistor to be turned on and time during which the second switch signal controls the second control transistor to be turned on within one clock period is the valid time of the gate driving signal.

When implemented, the gate driving control unit includes:
a first control transistor, wherein a first electrode of the first control transistor accesses the gate driving signal, a gate electrode of the first control transistor accesses a first switch signal, and a second electrode of the first control transistor is connected with a $k^{th}$ row of pixel circuits;

a second control transistor, wherein a first electrode of the second control transistor accesses the gate driving signal, a gate electrode of the second control transistor accesses a second switch signal, and a second electrode of the second control transistor is connected with a $k+1^{th}$ row of pixel circuits; and a third control transistor, wherein a first electrode of the third control transistor accesses the gate driving signal, a gate electrode of the third control transistor accesses a third switch signal, and a second electrode of the third control transistor is connected with a $k+2^{th}$ row of pixel circuits;

the first switch signal, the second switch signal and the third switch signal are clock signals;

a phase of the first switch signal, a phase of the second switch signal and a phase of the third switch signal differ by 120° in sequence;

a clock period of the first switch signal, a clock period of the second switch signal and a clock period of the third switch signal are all equal to the valid time of the gate driving signal;

a sum of time during which the first switch signal controls the first control transistor to be turned on, time during which the second switch signal controls the second control transistor to be turned on, and time during which the third switch signal controls the third control transistor to be turned on within one clock period is the valid time of the gate driving signal;

k is a positive integer, and $1 \le k \le M-2$.

When implemented, the shift register unit includes: a first output control unit, a second output control unit, a first node control unit, a second node control unit and a reset unit, wherein the first node control unit is connected with the first output control unit through a first node, the second node control unit is connected with the second output control unit through a second node, the first output control unit is configured to control the gate driving signal output terminal to output a first clock signal when a potential of the first node is a high level;

the second output control unit is configured to control a potential of the gate driving signal to be a first low level when a potential of the second node is a high level; the gate driving signal is output by the gate signal output terminal;

a first node control unit is configured to control the potential of the first node to be a high level when an input signal is a high level and control the potential of the first node to be the first low level when the potential of the second node is a high level; the input signal is input by an input terminal;

the second node control unit is configured to control the potential of the second node to be the first low level when the potential of the first node is a high level and control the potential of the second node to be a high level when a potential of a second clock signal is a high level; and a reset unit is configured to control the potential of the first node to be a second low level when a reset signal is a high level and control the potential of the gate driving signal to be a low level when the potential of the second clock signal is a high level; the reset signal is input by a reset terminal;

a phase of the first clock signal is opposite to a phase of the second clock signal.

When implemented, the shift register unit further includes a starting unit for controlling the potential of the second node to be a high level when a starting signal input to the starting unit is a high level so as to reset the second node and the gate driving signal output terminal before the shift register unit works.

When implemented, the first output control unit includes a first output transistor and a storage capacitor;

a gate electrode of the first output transistor is connected with the first node, a first electrode of the first output transistor is connected with the gate driving signal output terminal, and a second electrode of the first output transistor accesses the first clock signal;

the storage capacitor is connected between the first node and the gate driving signal output terminal;

the second output control unit comprises a second output transistor, a gate electrode of the second output transistor is connected with the second node, a first electrode of the second output transistor accesses the first low level, and a second electrode of the second output transistor is connected with the gate driving signal output terminal;

the reset unit comprises a first reset transistor and a second reset transistor, a gate electrode of the first reset transistor accesses the reset signal, a first electrode of the first reset transistor accesses the second low level, and a second electrode of the first reset transistor is connected with the first node; a gate electrode of the second reset transistor accesses the second clock signal, a first electrode of the second reset transistor accesses the first low level, and a second electrode of the second reset transistor is connected with the gate driving signal output terminal.

When implemented, the first node control unit includes:

a first switch transistor, wherein a gate electrode of the first switch transistor accesses the input signal, a first electrode of the first switch transistor is connected with the first node, and a second electrode of the first switch transistor accesses a high level; and a second switch transistor, wherein a gate electrode of the second switch transistor is connected with the second node, a first electrode of the second switch transistor accesses the first low level, and a second electrode of the second switch transistor is connected with the first node;

the second node control unit comprises:

a third switch transistor, wherein a first electrode of the third switch transistor is connected with a second node control terminal, and a gate electrode and a second electrode of the third switch transistor access the second clock signal;

a fourth switch transistor, wherein a gate electrode of the fourth switch transistor is connected with the second node control terminal, a first electrode of the fourth switch transistor is connected with the second node, and a second electrode of the fourth switch transistor accesses the second clock signal;

a fifth switch transistor, wherein a gate electrode of the fifth switch transistor is connected with the first node, a first electrode of the fifth switch transistor accesses the first low level, and a second electrode of the fifth switch transistor is connected with the second node control terminal; and a sixth switch transistor, wherein a gate electrode of the sixth switch transistor is connected with the first node, a first electrode of the sixth switch transistor accesses the first low level, and a second electrode of the sixth switch transistor is connected with the second node.

The present disclosure further provides a gate driving method, includes:

a plurality of cascaded shift register units included in a gate driving circuit respectively outputting gate driving signals through respective gate driving signal output terminals;

when the gate driving signal is valid, time-divisionally turning on N control transistors respectively connected between the gate driving signal output terminal and N rows of pixel circuits so as to transmit the gate driving signals to N rows of pixel circuits time-divisionally; N is an integer greater than 1 and smaller than or equal to M, and M is a total number of rows of pixel circuits.

When implemented, a valid time of the gate driving signal is T;

when the gate driving signal and a $i^{th}$ switch signal controlling a $i^{th}$ control transistor are valid at the same time, the $i^{th}$ control transistor is turned on to transmit the gate driving signal to a $j^{th}$ row of pixel circuits, the $i^{th}$ control transistor is cut off after remaining turned on for T/N to cut off a passage between the gate driving signal output terminal of the shift register unit and the $j^{th}$ row of pixel circuits;

when the gate driving signal and a $i+1^{th}$ switch signal controlling a $i+1^{th}$ control transistor are valid at the same time, the $i+1^{th}$ control transistor is turned on to transmit the gate driving signal to a $j+1^{th}$ row of pixel circuits, the $i+1^{th}$ control transistor is cut off after remaining turned on for T/N to cut off a passage between the gate driving signal output terminal of the shift register unit and the $j+1^{th}$ row of pixel circuits;

the $i^{th}$ switch signal and the $i+1^{th}$ switch signal are clock signals, there is a difference of 360/N° between a phase of the $i^{th}$ switch signal and a phase of the $i+1^{th}$ switch signal, a clock period of the $i^{th}$ switch signal and a clock period of the $i+1^{th}$ switch signal are both equal to the valid time of the gate driving signal;

a sum of time during which the N control transistors are turned on within one clock period is equal to the valid time of the gate driving signal;

i is a positive integer, and $1 \leq i \leq N-1$, j is a positive integer, and $1 \leq j \leq M-1$, M is a total number of rows of the pixel circuits.

The present disclosure further provides a display device, comprising the above-mentioned gate driving circuit.

Compared with the prior art, the gate driving circuit, the gate driving method and the display device as described in the present disclosure adopt a plurality of cascaded shift register units, and can drive at least two rows of pixel circuits with one shift register unit, which can save space and thereby enable the display device of high PPI to achieve a narrow bezel.

DETAILED DESCRIPTION

The technical solutions in the embodiments of the present disclosure will be described clearly and thoroughly with reference to the drawings of the embodiments of the present disclosure. Obviously, the embodiments described are only part of, rather than all of, the embodiments of the present disclosure. All other embodiments conceived by a person skilled in the art based on the embodiments of the present disclosure without doing any creative work shall fall within the protection scope of the present disclosure.

All of the transistors adopted in all embodiments of the present disclosure can be thin film transistors or field effect transistors or other devices that having the same property. In the embodiments of the present disclosure, in order to distinguish the two electrodes other than the gate electrode in the transistor, one electrode is called as a source electrode, and the other one is called as a drain electrode. In addition, transistors can be divided into N type transistors and P type transistors depending on their properties. In the driving circuits provided in the embodiments of the present disclosure, all of the transistors are described by taking N type transistors as an example, and it should be appreciated that implementation by using P type transistors can be readily conceived by a person skilled in the art without doing any creative work, and thus should also fall within the protection scope of the embodiments of the present disclosure.

In the driving circuit provided by the embodiments of the present disclosure, all of the transistors are described by taking N type transistors as an example, wherein, the first electrode of a N type transistor may be a source electrode, and the second electrode of the N type transistor may be a drain electrode. It should be appreciated that implementation by using P type transistors can be readily conceived by a person skilled in the art without doing any creative work, and thus should also fall within the protection scope of the embodiments of the present disclosure.

Figure 1:
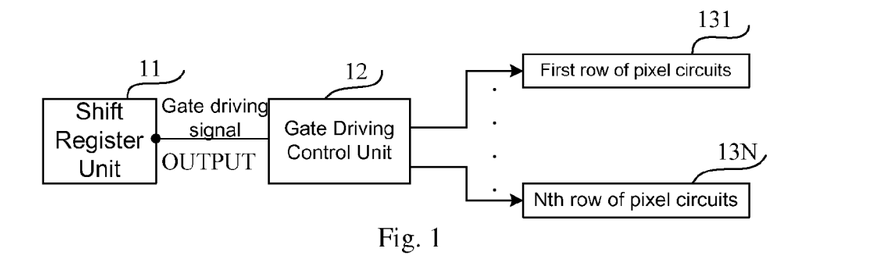
FIG. 1 is a structural block diagram of a gate driving circuit according to an embodiment of the present disclosure.

The gate driving circuit as described in the embodiments of the present disclosure includes a plurality of cascaded shift register units for outputting gate driving signals. As shown in FIG. 1, each of the gate driving signals is output by a gate driving signal output terminal OUTPUT of the shift register unit 11. The gate driving circuit further includes:
a gate driving control unit 12 connected with the shift register unit 11 for controlling the gate driving signal to be transmitted to N rows of pixel circuits time-divisionally, wherein N is a positive integer greater than or equal to 2.

In FIG. 1, the N rows of pixel circuits are the first row of pixel circuits 131 to the $N^{th}$ row of pixel circuits 13N.

The gate driving circuit of the present disclosure includes a plurality of cascaded shift register units, and can drive at least two rows of pixel circuits with one shift register unit, which can save space and thereby enable the display device of high PPI to achieve a narrow bezel.

When implemented, the gate driving control unit includes:
N control switches respectively connected between the gate driving signal output terminal OUTPUT and the N rows of pixel circuits;
controlling the gate driving signal to be transmitted to the N rows of pixel circuits time-divisionally through switch signals respectively accessing the N control switches.

Figure 2:
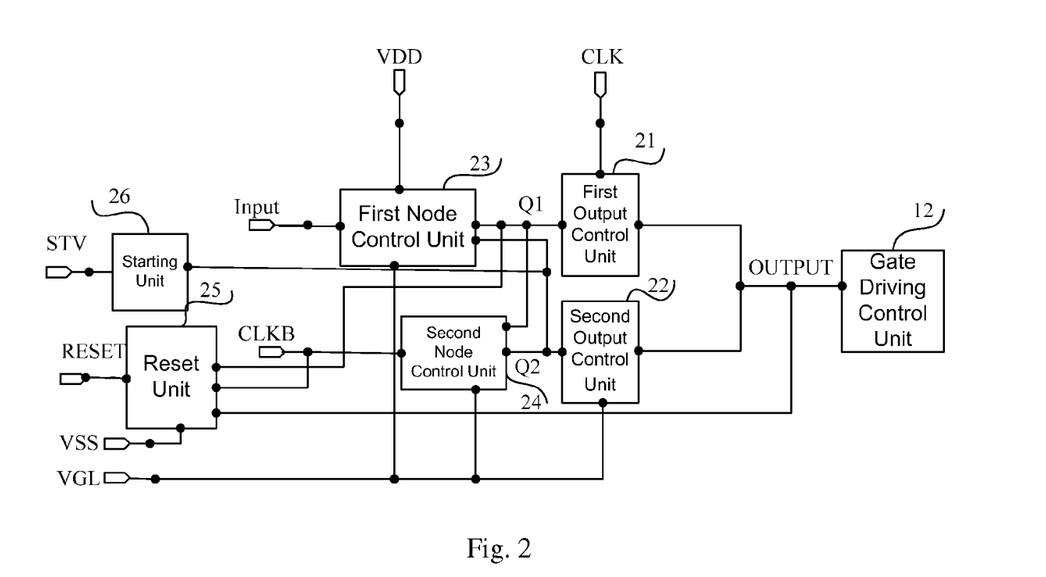
FIG. 2 is a structural schematic diagram of the gate driving circuit according to an embodiment of the present disclosure.

As shown in FIG. 2, in the gate driving circuit as described in an embodiment of the present disclosure, the shift register unit includes:
a first output control unit 21 for controlling the gate driving signal output terminal OUTPUT to output a first clock signal CLK when the potential of a first node Q1 is a high level;
a second output control unit 22 for controlling the potential of the gate driving signal to be a first low level VGL when the potential of a second node Q2 is a high level; the gate driving signal is output by a gate signal output terminal OUTPUT;
a first node control unit 23 for controlling the potential of the first node Q1 to be a high level VDD when an input signal is a high level and controlling the potential of the first node Q1 to be the first low level VGL when the potential of the second node Q2 is a high level; the input signal is input by an input terminal Input;
a second node control unit 24 for controlling the potential of the second node Q2 to be the first low level VGL when the potential of the first node Q1 is a high level and controlling the potential of the second node Q2 to be a high level when a potential of a second clock signal CLKB is a high level; and
a reset unit 25 for controlling the potential of the first node Q1 to be a second low level VSS when a reset signal is a high level and controlling the potential of the gate driving signal to be a low level when the potential of the second clock signal CLKB is a high level; the reset signal is input by a reset terminal RESET;
the gate driving signal is output by the gate driving signal output terminal OUTPUT;
the phase of the first clock signal CLK is opposite to the phase of the second clock signal CLKB.

Figure 5:
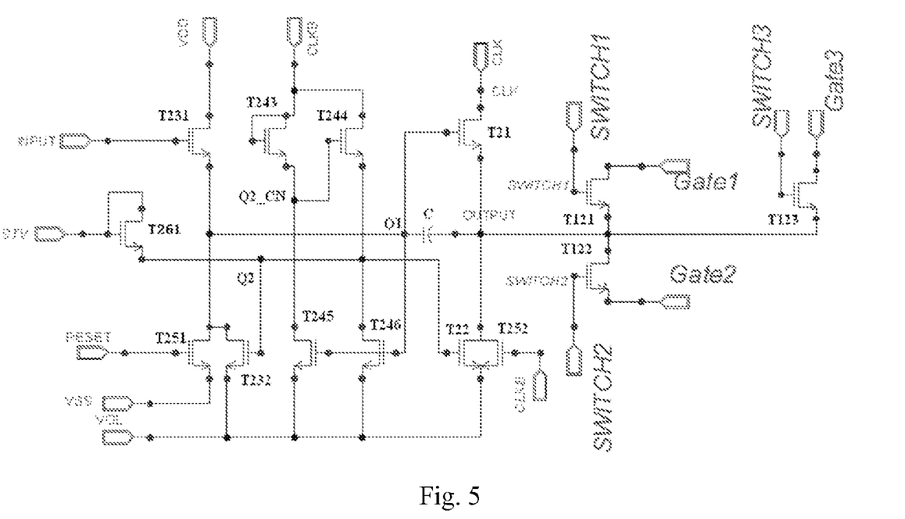
FIG. 5 is a circuit diagram of the gate driving circuit according to another embodiment of the present disclosure.

Specifically, as shown in FIG. 2, the gate driving circuit as described in an embodiment of the present disclosure further includes a starting unit 26 for controlling the potential of the second node Q2 to be a high level when a starting signal STV is a high level so as to reset the second node Q2 and the gate driving signal output terminal OUTPUT before the shift register unit works to avoid interference of noise. To be specific, the starting unit 26 may be implemented by a transistor T261 as shown in FIG. 5.

Figure 3:
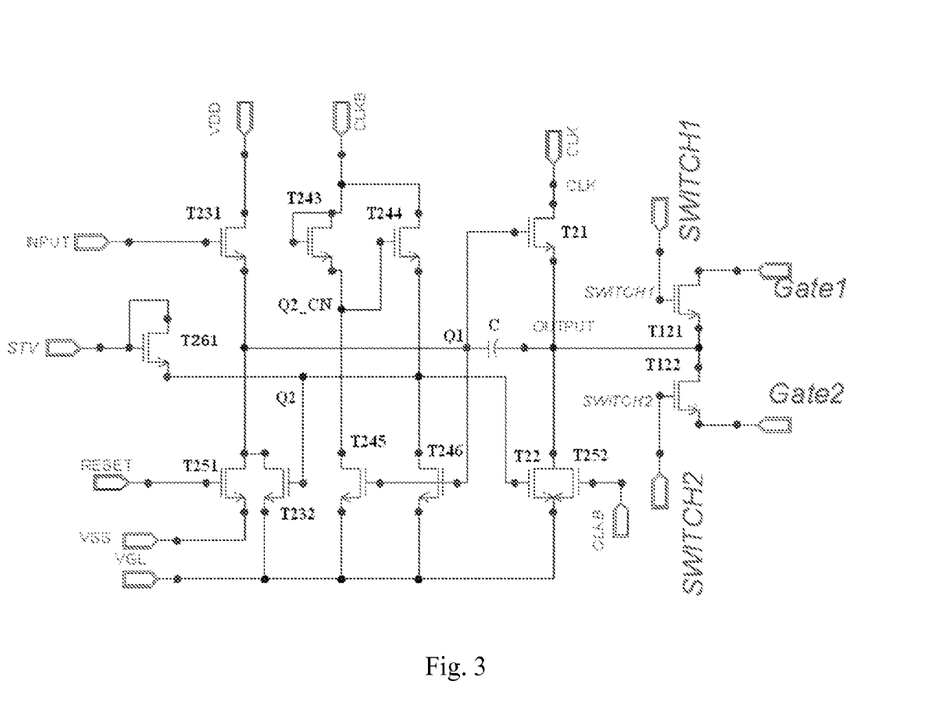
FIG. 3 is a circuit diagram of the gate driving circuit according to an embodiment of the present disclosure.

Specifically, as shown in FIG. 3, the first output control unit 21 includes a first output transistor T21 and a storage capacitor C;
a gate electrode of the first output transistor T21 is connected with the first node Q1, a first electrode thereof is connected with the gate driving signal output terminal OUTPUT, and a second electrode thereof accesses the first clock signal CLK;
the storage capacitor C is connected between the first node Q1 and the gate driving signal output terminal OUTPUT;
the second output control unit 22 includes a second output transistor T22, a gate electrode of the second output transistor T22 is connected with the second node Q2, a first electrode thereof accesses a first low level VGL, and a second electrode thereof is connected with the gate driving signal output terminal OUTPUT;

the reset unit 25 includes a first reset transistor T251 and a second reset transistor T252;

a gate electrode of the first reset transistor T251 accesses the reset signal, a first electrode thereof accesses a second low level VSS, and a second electrode thereof is connected with the first node Q1;

a gate electrode of the second reset transistor T252 accesses the second clock signal CLKB, a first electrode thereof accesses a first low level VGL, and a second electrode thereof is connected with the gate driving signal output terminal OUTPUT.

Specifically, as shown in FIG. 3, the first node control unit 23 includes:

a first switch transistor T231, wherein a gate electrode of the first switch transistor T231 accesses the input signal, a first electrode thereof is connected with the first node Q1, and a second electrode thereof accesses a high level VDD; and a second switch transistor T232, wherein a gate electrode of the second switch transistor is connected with the second node Q2, a first electrode thereof accesses a first low level VGL, and a second electrode thereof is connected with the first node Q1;

the second node control unit 24 includes:

a third switch transistor T243, wherein a first electrode of the third switch transistor is connected with a second node control terminal Q2_CN, and a gate electrode and a second electrode thereof access the second clock signal CLKB;

a fourth switch transistor T244, a the gate electrode of the fourth switch transistor T244 is connected with the second node control terminal Q2_CN, a first electrode thereof is connected with the second node Q2, and a second electrode thereof accesses the second clock signal CLKB;

a fifth switch transistor T245, wherein a gate electrode of the fifth switch transistor is connected with the first node Q1, a first electrode there of accesses a first low level VGL, and a second electrode thereof is connected with the second node control terminal Q2_CN; and a sixth switch transistor T246, wherein a gate electrode of the sixth switch transistor is connected with the first node Q1, a first electrode thereof accesses a first low level VGL, and a second electrode thereof is connected with the second node Q2.

Optionally, the gate driving control unit includes N control transistors, and each of the control transistors includes a gate electrode, a first electrode and a second electrode;

a $i^{th}$ control transistor has a first electrode accessing the gate driving signal, a gate electrode accessing a $i^{th}$ switch signal, and a second electrode being connected with a $j^{th}$ row of pixel circuits;

a $i+1^{th}$ control transistor has a first electrode accessing the gate driving signal, a gate electrode accessing a $i+1^{th}$ switch signal, and a second electrode being connected with a $j+1^{th}$ row of pixel circuits;

wherein, the $i^{th}$ switch signal and the $i+1^{th}$ switch signal are clock signals, there is a difference of 360/N° between the phase of the $i^{th}$ switch signal and the phase of the $i+1^{th}$ switch signal, the clock period of the $i^{th}$ switch signal is equal to a valid time of the gate drive signal, and the clock period of the $i+1^{th}$ switch signal is equal to a valid time of the gate driving signal; and a sum of time during which the N control transistors are turned on within one clock period is equal to the valid time of the gate driving signal;

i is an positive integer, and 1≤i≤N−1, j is an positive integer, and 1≤j≤M−1, M is the total number of rows of the pixel circuits.

Specifically, the gate driving control unit includes:

a first control transistor, a the first electrode of the first control transistor accesses the gate driving signal, a gate electrode thereof accesses the first switch signal, and a second electrode thereof is connected with the $j^{th}$ row of pixel circuits; and a second control transistor, wherein a first electrode of the second control transistor accesses the gate driving signal, a gate electrode thereof accesses the second switch signal, and a second electrode thereof is connected with the $j+1^{th}$ row of pixel circuits;

the first switch signal and the second switch signal are clock signals, the phase of the first switch signal is opposite to the phase of the second switch signal, the clock period of the first switch signal is equal to the valid time of the gate driving signal, and the clock period of the second switch signal is equal to the valid time of the gate driving signal, j is an positive integer, and 1≤j≤M−1, and M is a total number of rows of the pixel circuits.

When implemented, the gate driving control unit includes:

a first control transistor, wherein a first electrode of the first control transistor accesses the gate driving signal, a gate electrode thereof accesses the first switch signal, and a second electrode thereof is connected with a $k^{th}$ row of pixel circuits;

a second control transistor, wherein a first electrode of the second control transistor accesses the gate driving signal, a gate electrode thereof accesses the second switch signal, and a second electrode thereof is connected with a $k+1^{th}$ row of pixel circuits; and a third control transistor, wherein a first electrode of the third control transistor accesses the gate driving signal, a gate electrode thereof accesses a third switch signal, and a second electrode thereof is connected with a $k+2^{th}$ row of pixel circuits;

the first switch signal, the second switch signal and the third switch signal are clock signals;

the phase of the first switch signal, the phase of the second switch signal and the phase of the third switch signal differ by 120° in sequence;

the clock period of the first switch signal is equal to the valid time of the gate driving signal, the clock period of the second switch signal is equal to the valid time of the gate driving signal, and the clock period of the third switch signal is equal to the valid time of the gate driving signal; and a sum of time during which the first switch signal controls the first control transistor to be turned on, time during which the second switch signal controls the second control transistor to be turned on and time during which the third switch signal controls the third control transistor to be turned on within one clock period is the valid time of the gate driving signal;

k is a positive integer, and 1≤k≤M−2.

As shown in FIG. 3, the gate driving control unit 12 includes:

a first control transistor T121, wherein a gate electrode of the first control transistor T121 accesses the first switch signal SWITCH1, a first electrode thereof is connected with the gate driving signal output terminal OUTPUT, and a second electrode thereof is connected with the gate driving signal input terminal Gate1 of the first row of pixel circuits;

a second control transistor T122, wherein a gate electrode of the second control transistor T122 accesses the second switch signal SWITCH2, a first electrode thereof is connected with the gate driving signal input terminal Gate2 of the second row of pixel circuits, and a second electrode thereof is connected with the gate driving signal output terminal OUTPUT;

the first switch signal SWITCH1 and the second switch signal SWITCH2 are clock signals, the phase of the first switch signal SWITCH1 is opposite to the phase of the second switch signal SWITCH2, and the clock period of the first switch signal is equal to the valid time of the gate driving signal, and the clock period of the second switch signal is equal to the valid time of the gate driving signal, so that a sum of time during which the gate driving signal transmitted to the first row of pixel circuits remains valid and time during which the gate driving signal transmitted to the second row of pixel circuits remains valid is equal to the valid time of the gate driving signal output by the gate driving signal output terminal OUTPUT.

Since the embodiments of the present disclosure adopt N type transistors, the first node Q1 can also be called as a pull-up node, the second node Q2 can also be called as a pull-down node, and the second node control terminal Q2_CN can also be called as a pull-down node control terminal;

when the gate driving circuit as shown in FIG. 3 works, if Input outputs a high level, T231 is started to charge Q1, and when CLK is a high level, T21 turns on OUTPUT to output CLK, and meanwhile, bootstrapping of C further increases the potential of Q1; afterwards the reset signal turns on T251, CLKB turns on T252 to discharge Q1 and OUTPUT.

In order to correspond to bi-directional scanning, two signals, namely, a high level VDD and a second low level VSS, are configured in the present disclosure, and these two levels are interchanged with each other during forward scanning and reverse scanning. Meanwhile, in order to ensure the consistency of forward scanning and reverse scanning, the size of the first control transistor T231 is designed to be the same with that of the first reset transistor T251 in the present disclosure.

Figure 4:
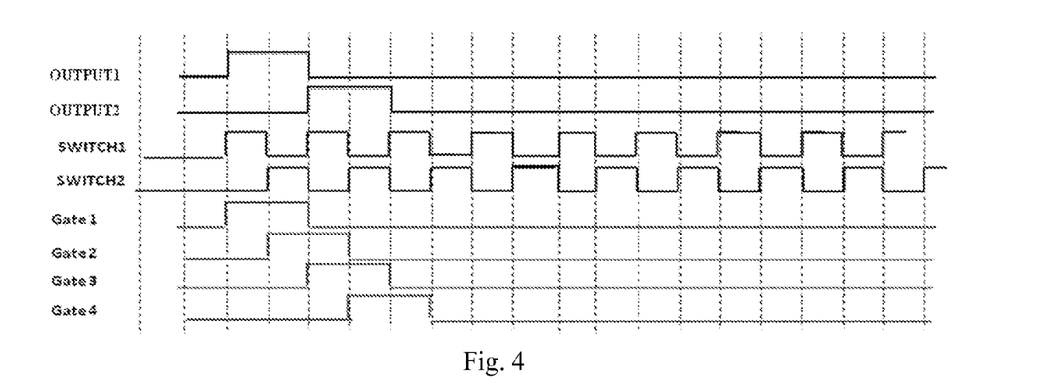
FIG. 4 is a working sequence chart of the gate driving circuit according to an embodiment of the present disclosure.

In the embodiment as shown in FIG. 3, a first control transistor T121 and a second control transistor T122 are added in the present disclosure to achieve the purpose of design that one gate driving circuit corresponds to two rows of pixel circuits. As shown in FIG. 4, when SWITCH1 is a high level, the gate driving circuit as described in the embodiment of the present disclosure outputs a gate driving signal to Gate1, the first row of pixel circuits work normally; when WITCH2 is a high level, the gate driving circuit as described in the embodiment of the present disclosure outputs a gate driving signal to Gate2, and the second row of pixel circuits work normally. Of course, the first control transistor and the second control transistor can also control the work of non-adjacent rows of pixel circuits.

In FIG. 4, OUTPUT1 is the gate driving signal output terminal of the first stage gate driving circuit, and OUTPUT2 is the gate driving signal output terminal of the second stage gate driving circuit. The gate driving signal output by OUTPUT1 is provided to Gate1 and Gate2, and the gate driving signal output by OUTPUT2 is provided to the gate driving signal input terminal Gate3 of the third row of pixel circuits and the gate driving signal input terminal Gate4 of the fourth row of pixel circuits. As shown in FIG. 4, N=2, M=4.

FIG. 5 is a circuit diagram of a gate driving circuit according to another embodiment of the present disclosure. As compared with the embodiment shown in FIG. 3, the embodiment of the gate driving circuit shown in FIG. 5 adopts one gate driving circuit corresponding to three rows of pixel circuits so as to further narrow the bezel. As compared with FIG. 3, a third control transistor T123 included in the gate driving control unit is added in FIG. 5, a gate electrode of the third control transistor accesses the third switch signal SWITCH3, a first electrode thereof is connected with the gate driving signal output terminal OUTPUT, and a second electrode thereof is connected with the gate driving signal input terminal Gate3 of the third row of pixel circuits.

In FIG. 5, the first switch signal SWITCH1, the second switch signal SWITCH2 and the third switch signal SWITCH3 are all clock signals;

the phase of the first switch signal SWITCH1, the phase of the second switch signal SWITCH2 and the phase of the third switch signal SWITCH3 differ by 120° in sequence;

the clock period of the first switch signal SWITCH1 is equal to the valid time of the gate driving signal, the clock period of the second switch signal SWITCH2 is equal to the valid time of the gate driving signal, and the clock period of the third switch signal is equal to the valid time of the gate driving signal; and a sum of time during which the first switch signal SWITCH1 controls the first control transistor to be turned on, time during which the second switch signal SWITCH2 controls the second control transistor to be turned on, and time during which the third switch signal SWITCH3 controls the third control transistor to be turned on within one clock period is the valid time of the gate driving signal.

Figure 6:
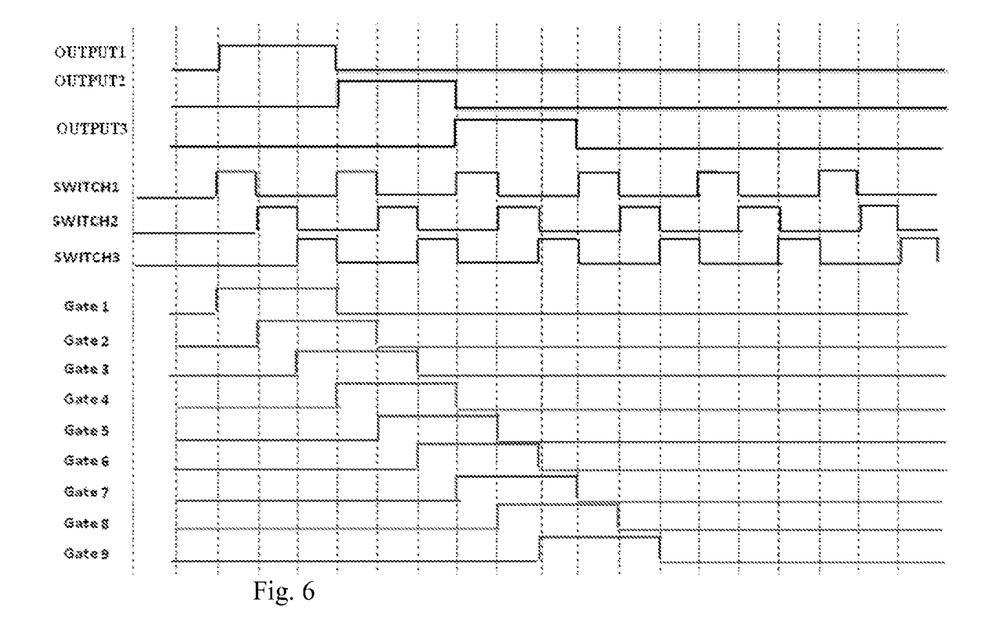
FIG. 6 is a working sequence chart of the gate driving circuit according to an embodiment of the present disclosure.

FIG. 6 is a working sequence chart of a gate driving circuit according to an embodiment of the present disclosure. In FIG. 6, OUTPUT1 is the gate driving signal output terminal of the first stage gate driving circuit, OUTPUT2 is the gate driving signal output terminal of the second stage gate driving circuit, and OUTPUT3 is the gate driving signal output terminal of the third stage gate driving circuit. The gate driving signal output by OUTPUT1 is provided to Gate1, Gate2 and Gate3; the gate driving signal output by OUTPUT2 is provided to the gate driving signal input terminal Gate4 of the fourth row of pixel circuits, the gate driving signal input terminal Gate5 of the fifth row of pixel circuits and the gate driving signal input terminal Gate6 of the sixth row of pixel circuits; the gate driving signal output by OUTPUT3 is provided to the gate driving signal input terminal Gate7 of the seventh row of pixel circuits, the gate driving signal input terminal Gate8 of the eighth row of pixel circuits and the gate driving signal input terminal Gate9 of the ninth row of pixel circuits. As shown in FIG. 6, N=3, M=9.

The present disclosure further provides a gate driving method for driving the above gate driving circuit, the gate driving circuit includes: a plurality of cascaded shift register units included in the gate driving circuit respectively outputting gate driving signals through respective gate driving signal output terminals;

when the gate driving signals are valid, N control transistors respectively connected between the gate driving signal output terminals and N rows of pixel circuits are time-divisionally turned on so as to transmit the gate driving signals to N rows of pixel circuits time-divisionally;

N is an integer greater than 1 and smaller than or equal to M, M is the total number of rows of pixel circuits.

According to a specific embodiment, N=2, a transistor connected between the gate driving signal output terminal of a shift register unit and the $j^{th}$ row of pixel circuits is the first control transistor, and a transistor connected between the gate driving signal output terminal and the $j+1^{th}$ row of pixel circuits is the second control transistor;

when the gate driving signal is valid, the first control transistor and the second control transistor are turned on time-divisionally so as to transmit the gate driving signal to the $j^{th}$ row of pixel circuits and the $j+1^{th}$ row of pixel circuits time-divisionally;

j is a positive integer, and $1 \leq j \leq M-1$, M is the total number of the rows of the pixel circuits.

According to a specific embodiment, a transistor connected between the gate driving signal output terminal of a shift register unit and the $k^{th}$ row of pixel circuits is the first control transistor, a transistor connected between the gate driving signal output terminal and the $k+1^{th}$ row of pixel circuits is the second control transistor, and a transistor connected between the gate driving signal output terminal and the $k+2^{th}$ row of pixel circuits is the third control transistor;

when the gate driving signal is valid, the first control transistor, the second control transistor and the third control transistor are turned on time-divisionally so as to transmit the gate driving signal to the $k^{th}$ row of pixel circuits, the $k+1^{th}$ row of pixel circuits and the $k+2^{th}$ row of pixel circuits time-divisionally;

k is a positive integer, and $1 \leq k \leq M-2$, M is the number of rows of the pixel circuits.

Specifically, the valid time of the gate driving signal is T;

when the gate driving signal and the $i^{th}$ switch signal controlling the $i^{th}$ control transistor are both valid, the $i^{th}$ control transistor is turned on to transmit the gate driving signal to the $j^{th}$ row of pixel circuits, the $i^{th}$ control transistor is cut off after remaining turned on for T/N to cut off the passage between the gate driving signal output terminal of the shift register unit and the $j^{th}$ row of pixel circuits;

when the gate driving signal and the $i+1^{th}$ switch signal controlling a $i+1^{th}$ control transistor are both valid, the $i+1^{th}$ control transistor is turned on to transmit the gate driving signal to the $j+1^{th}$ row of pixel circuits, the $i+1^{th}$ control transistor is cut off after remaining turned on for T/N to cut off the passage between the gate driving signal output terminal of the shift register unit and the $j+1^{th}$ row of pixel circuits;

the $i^{th}$ switch signal and the $i+1^{th}$ switch signal are clock signals, there is a difference of 360/N° between the phase of the $i^{th}$ switch signal and the phase of the $i+1^{th}$ switch signal, the clock period of the $i^{th}$ switch signal and the clock period of the $i+1^{th}$ switch signal are both equal to the valid time of the gate driving signal; and a sum of time during which the N control transistors are turned on within one clock period is equal to the valid time of the gate driving signal;

i is an positive integer, and $1 \leq i \leq N-1$, j is an positive integer, and $1 \leq j \leq M-1$, M is the total number of rows of the pixel circuits.

The present disclosure provides a display device, including the above gate driving circuit. The display device may include a liquid crystal display device, such as a liquid crystal panel, a liquid crystal television, a mobile phone, and a liquid crystal display. In addition to the liquid crystal display device, the display device may also include an organic light-emitting display or other types of displays such as an electronic reader and the like. The shift register can be used as a scanning circuit or a gate driving circuit of a display device for providing the progressive scanning function and delivering scanning signals to the display area.

The above is preferred embodiments of the present disclosure. It should be appreciated that a person skilled in the art may further make several improvements and modifications without departing from the principle of the present disclosure, and these improvements and modifications shall also be deemed as within the protection scope of the present disclosure.

What is claimed is:

1. A gate driving circuit, comprising a plurality of cascaded shift register units for outputting gate driving signals, each of the gate driving signals being output by a gate driving signal output terminal of each of the shift register units; the gate driving circuit further comprises:
   a gate driving control unit, connected with the shift register unit and configured to control the gate driving signal to be transmitted to N rows of pixel circuits time-divisionally, wherein N is a positive integer greater than or equal to 2.

2. The gate driving circuit according to claim 1, wherein, the gate driving control unit comprises:
   N control switches respectively connected between the gate driving signal output terminal and the N rows of pixel circuits;
   wherein the gate driving signal is controlled to be transmitted to the N rows of pixel circuits time-divisionally through respectively accessing switch signals of the N control switches.

3. The gate driving circuit according to claim 2, wherein, the gate driving control unit comprises N control transistors, each of the N control transistor comprises a gate electrode, a first electrode and a second electrode;
   wherein a $i^{th}$ control transistor has a first electrode accessing the gate driving signal, a gate electrode accessing a $i^{th}$ switch signal, and a second electrode being connected with a $j^{th}$ row of pixel circuits;
   a $i+1^{th}$ control transistor has a first electrode accessing the gate driving signal, a gate electrode accessing a $i+1^{th}$ switch signal, and a second electrode being connected with a $j+1^{th}$ row of pixel circuits;
   wherein, the $i^{th}$ switch signal and the $i+1^{th}$ switch signal are clock signals, there is a difference of 360/N° between a phase of the $i^{th}$ switch signal and a phase of the $i+1^{th}$ switch signal, a clock period of the $i^{th}$ switch signal is equal to a valid time of the gate driving signal, and a clock period of the $i+1^{th}$ switch signal is equal to the valid time of the gate driving signal;
   a sum of time during which the N control transistors are turned on within one clock period is equal to the valid time of the gate driving signal;
   i is a positive integer, and $1 \leq i \leq N-1$, j is a positive integer, and $1 \leq j \leq M-1$, M is a total number of rows of the pixel circuits.

4. The gate driving circuit according to claim 3, wherein, the gate driving control unit comprises:
   a first control transistor, wherein a first electrode of the first control transistor accesses the gate driving signal, a gate electrode of the first control transistor accesses a first switch signal, and a second electrode of the first control transistor is connected with the $j^{th}$ row of pixel circuits; and
   a second control transistor, wherein a first electrode of the second control transistor accesses the gate driving signal, a gate electrode of the second control transistor accesses a second switch signal, and a second electrode of the second control transistor is connected with the $j+1^{th}$ row of pixel circuits;
   the first switch signal and the second switch signal are clock signals, a phase of the first switch signal is opposite to a phase of the second switch signal, and a clock period of the first switch signal and a clock period of the second switch signal are both equal to the valid time of the gate driving signal;
   a sum of time during which the first switch signal controls the first control transistor to be turned on and time during which the second switch signal controls the second control transistor to be turned on within one clock period is the valid time of the gate driving signal.

5. The gate driving circuit according to claim 3, wherein, the gate driving control unit comprises:
- a first control transistor, wherein a first electrode of the first control transistor accesses the gate driving signal, a gate electrode of the first control transistor accesses a first switch signal, and a second electrode of the first control transistor is connected with a $k^{th}$ row of pixel circuits;
- a second control transistor, wherein a first electrode of the second control transistor accesses the gate driving signal, a gate electrode of the second control transistor accesses a second switch signal, and a second electrode of the second control transistor is connected with a $k+1^{th}$ row of pixel circuits; and
- a third control transistor, wherein a first electrode of the third control transistor accesses the gate driving signal, a gate electrode of the third control transistor accesses a third switch signal, and a second electrode of the third control transistor is connected with a $k+2^{th}$ row of pixel circuits;
- the first switch signal, the second switch signal and the third switch signal are clock signals;
- a phase of the first switch signal, a phase of the second switch signal and a phase of the third switch signal differ by 120° in sequence;
- a clock period of the first switch signal, a clock period of the second switch signal and a clock period of the third switch signal are all equal to the valid time of the gate driving signal;
- a sum of time during which the first switch signal controls the first control transistor to be turned on, time during which the second switch signal controls the second control transistor to be turned on, and time during which the third switch signal controls the third control transistor to be turned on within one clock period is the valid time of the gate driving signal;
- k is a positive integer, and 1≤k≤M−2.

6. The gate driving circuit according to claim 1, wherein, the shift register unit comprises: a first output control unit, a second output control unit, a first node control unit, a second node control unit and a reset unit, wherein the first node control unit is connected with the first output control unit through a first node, the second node control unit is connected with the second output control unit through a second node,
- the first output control unit is configured to control the gate driving signal output terminal to output a first clock signal when a potential of the first node is a high level;
- the second output control unit is configured to control a potential of the gate driving signal to be a first low level when a potential of the second node is a high level; the gate driving signal is output by the gate signal output terminal;
- a first node control unit is configured to control the potential of the first node to be a high level when an input signal is a high level and control the potential of the first node to be the first low level when the potential of the second node is a high level; the input signal is input by an input terminal;
- the second node control unit is configured to control the potential of the second node to be the first low level when the potential of the first node is a high level and control the potential of the second node to be a high level when a potential of a second clock signal is a high level; and
- a reset unit is configured to control the potential of the first node to be a second low level when a reset signal is a high level and control the potential of the gate driving signal to be a low level when the potential of the second clock signal is a high level; the reset signal is input by a reset terminal;
- a phase of the first clock signal is opposite to a phase of the second clock signal.

7. The gate driving circuit according to claim 6, wherein, the shift register unit further comprises a starting unit for controlling the potential of the second node to be a high level when a starting signal input to the starting unit is a high level so as to reset the second node and the gate driving signal output terminal before the shift register unit works.

8. The gate driving circuit according to claim 6, wherein, the first output control unit comprises a first output transistor and a storage capacitor;
- a gate electrode of the first output transistor is connected with the first node, a first electrode of the first output transistor is connected with the gate driving signal output terminal, and a second electrode of the first output transistor accesses the first clock signal;
- the storage capacitor is connected between the first node and the gate driving signal output terminal;
- the second output control unit comprises a second output transistor, a gate electrode of the second output transistor is connected with the second node, a first electrode of the second output transistor accesses the first low level, and a second electrode of the second output transistor is connected with the gate driving signal output terminal;
- the reset unit comprises a first reset transistor and a second reset transistor, a gate electrode of the first reset transistor accesses the reset signal, a first electrode of the first reset transistor accesses the second low level, and a second electrode of the first reset transistor is connected with the first node; a gate electrode of the second reset transistor accesses the second clock signal, a first electrode of the second reset transistor accesses the first low level, and a second electrode of the second reset transistor is connected with the gate driving signal output terminal.

9. The gate driving circuit according to claim 6, wherein, the first node control unit comprises:
- a first switch transistor, wherein a gate electrode of the first switch transistor accesses the input signal, a first electrode of the first switch transistor is connected with the first node, and a second electrode of the first switch transistor accesses a high level; and
- a second switch transistor, wherein a gate electrode of the second switch transistor is connected with the second node, a first electrode of the second switch transistor accesses the first low level, and a second electrode of the second switch transistor is connected with the first node;
- the second node control unit comprises:
- a third switch transistor, wherein a first electrode of the third switch transistor is connected with a second node control terminal, and a gate electrode and a second electrode of the third switch transistor access the second clock signal;
- a fourth switch transistor, wherein a gate electrode of the fourth switch transistor is connected with the second node control terminal, a first electrode of the fourth switch transistor is connected with the second node, and a second electrode of the fourth switch transistor accesses the second clock signal;
- a fifth switch transistor, wherein a gate electrode of the fifth switch transistor is connected with the first node, a first electrode of the fifth switch transistor accesses the first low level, and a second electrode of the fifth switch transistor is connected with the second node control terminal; and a sixth switch transistor, wherein a gate electrode of the sixth switch transistor is connected with the first node, a first electrode of the sixth switch transistor accesses the first low level, and a second electrode of the sixth switch transistor is connected with the second node.

10. A display device, comprising the gate driving circuit according to claim 1.

11. The display device according to claim 10, wherein, the gate driving control unit comprises:

N control switches respectively connected between the gate driving signal output terminals and the N rows of pixel circuits;

wherein the gate driving signal is controlled to be transmitted to the N rows of pixel circuits time-divisionally through respectively accessing switch signals of the N control switches.

12. The display device according to claim 11, wherein, the gate driving control unit comprises N control transistors, each of the N control transistor comprises a gate electrode, a first electrode and a second electrode;

wherein a $i^{th}$ control transistor has a first electrode accessing the gate driving signal, a gate electrode accessing a $i^{th}$ switch signal, and a second electrode being connected with a $j^{th}$ row of pixel circuits;

a $i+1^{th}$ control transistor has a first electrode accessing the gate driving signal, a gate electrode accessing a $i+1^{th}$ switch signal, and a second electrode being connected with a $j+1^{th}$ row of pixel circuits;

wherein, the $i^{th}$ switch signal and the $i+1^{th}$ switch signal are clock signals, there is a difference of 360/N° between a phase of the $i^{th}$ switch signal and a phase of the $i+1^{th}$ switch signal, a clock period of the $i^{th}$ switch signal is equal to a valid time of the gate driving signal, and a clock period of the $i+1^{th}$ switch signal is equal to the valid time of the gate driving signal;

a sum of time during which the N control transistors are turned on within one clock period is equal to the valid time of the gate driving signal;

i is a positive integer, and $1 \leq i \leq N-1$, j is a positive integer, and $1 \leq j \leq M-1$, M is a total number of rows of the pixel circuits.

13. The display device according to claim 12, wherein, the gate driving control unit comprises:

a first control transistor, wherein a first electrode of the first control transistor accesses the gate driving signal, a gate electrode of the first control transistor accesses a first switch signal, and a second electrode of the first control transistor is connected with the $j^{th}$ row of pixel circuits; and a second control transistor, wherein a first electrode of the second control transistor accesses the gate driving signal, a gate electrode of the second control transistor accesses a second switch signal, and a second electrode of the second control transistor is connected with the $j+1^{th}$ row of pixel circuits;

the first switch signal and the second switch signal are clock signals, a phase of the first switch signal is opposite to a phase of the second switch signal, and a clock period of the first switch signal and a clock period of the second switch signal are both equal to the valid time of the gate driving signal;

a sum of time during which the first switch signal controls the first control transistor to be turned on and time during which the second switch signal controls the second control transistor to be turned on within one clock period is the valid time of the gate driving signal.

14. The display device according to claim 12, wherein, the gate driving control unit comprises:

a first control transistor, wherein a first electrode of the first control transistor accesses the gate driving signal, a gate electrode of the first control transistor accesses a first switch signal, and a second electrode of the first control transistor is connected with a $k^{th}$ row of pixel circuits;

a second control transistor, wherein a first electrode of the second control transistor accesses the gate driving signal, a gate electrode of the second control transistor accesses a second switch signal, and a second electrode of the second control transistor is connected with a $k+1^{th}$ row of pixel circuits; and a third control transistor, wherein a first electrode of the third control transistor accesses the gate driving signal, a gate electrode of the third control transistor accesses a third switch signal, and a second electrode of the third control transistor is connected with a $k+2^{th}$ row of pixel circuits;

the first switch signal, the second switch signal and the third switch signal are clock signals;

a phase of the first switch signal, a phase of the second switch signal and a phase of the third switch signal differ by 120° in sequence;

a clock period of the first switch signal, a clock period of the second switch signal and a clock period of the third switch signal are all equal to the valid time of the gate driving signal;

a sum of time during which the first switch signal controls the first control transistor to be turned on, time during which the second switch signal controls the second control transistor to be turned on, and time during which the third switch signal controls the third control transistor to be turned on within one clock period is the valid time of the gate driving signal;

k is a positive integer, and $1 \leq k \leq M-2$.

15. The display device according to claim 10, wherein, the shift register unit comprises: a first output control unit, a second output control unit, a first node control unit, a second node control unit and a reset unit, wherein the first node control unit is connected with the first output control unit through a first node, the second node control unit is connected with the second output control unit through a second node, the first output control unit is configured to control the gate driving signal output terminal to output a first clock signal when a potential of the first node is a high level;

the second output control unit is configured to control a potential of the gate driving signal to be a first low level when a potential of the second node is a high level; the gate driving signal is output by the gate signal output terminal;

a first node control unit is configured to control the potential of the first node to be a high level when an input signal is a high level and control the potential of the first node to be the first low level when the potential of the second node is a high level; the input signal is input by an input terminal;

the second node control unit is configured to control the potential of the second node to be the first low level when the potential of the first node is a high level and control the potential of the second node to be a high level when a potential of a second clock signal is a high level; and a reset unit is configured to control the potential of the first node to be a second low level when a reset signal is a high level and control the potential of the gate driving signal to be a low level when the potential of the second clock signal is a high level; the reset signal is input by a reset terminal;

a phase of the first clock signal is opposite to a phase of the second clock signal.

16. The display device according to claim 15, wherein, the shift register unit further comprises a starting unit for controlling the potential of the second node to be a high level when a starting signal input to the starting unit is a high level so as to reset the second node and the gate driving signal output terminal before the shift register unit works.

17. The display device according to claim 15, wherein, the first output control unit comprises a first output transistor and a storage capacitor;

a gate electrode of the first output transistor is connected with the first node, a first electrode of the first output transistor is connected with the gate driving signal output terminal, and a second electrode of the first output transistor accesses the first clock signal;

the storage capacitor is connected between the first node and the gate driving signal output terminal;

the second output control unit comprises a second output transistor, a gate electrode of the second output transistor is connected with the second node, a first electrode of the second output transistor accesses the first low level, and a second electrode of the second output transistor is connected with the gate driving signal output terminal;

the reset unit comprises a first reset transistor and a second reset transistor, a gate electrode of the first reset transistor accesses the reset signal, a first electrode of the first reset transistor accesses the second low level, and a second electrode of the first reset transistor is connected with the first node; a gate electrode of the second reset transistor accesses the second clock signal, a first electrode of the second reset transistor accesses the first low level, and a second electrode of the second reset transistor is connected with the gate driving signal output terminal.

18. The display device according to claim 15, wherein, the first node control unit comprises:

a first switch transistor, wherein a gate electrode of the first switch transistor accesses the input signal, a first electrode of the first switch transistor is connected with the first node, and a second electrode of the first switch transistor accesses a high level; and a second switch transistor, wherein a gate electrode of the second switch transistor is connected with the second node, a first electrode of the second switch transistor accesses the first low level, and a second electrode of the second switch transistor is connected with the first node;

the second node control unit comprises:

a third switch transistor, wherein a first electrode of the third switch transistor is connected with a second node control terminal, and a gate electrode and a second electrode of the third switch transistor access the second clock signal;

a fourth switch transistor, wherein a gate electrode of the fourth switch transistor is connected with the second node control terminal, a first electrode of the fourth switch transistor is connected with the second node, and a second electrode of the fourth switch transistor accesses the second clock signal;

a fifth switch transistor, wherein a gate electrode of the fifth switch transistor is connected with the first node, a first electrode of the fifth switch transistor accesses the first low level, and a second electrode of the fifth switch transistor is connected with the second node control terminal; and a sixth switch transistor, wherein a gate electrode of the sixth switch transistor is connected with the first node, a first electrode of the sixth switch transistor accesses the first low level, and a second electrode of the sixth switch transistor is connected with the second node.

19. A gate driving method, comprising:

a plurality of cascaded shift register units comprised in a gate driving circuit respectively outputting gate driving signals through respective gate driving signal output terminals;

when the gate driving signal is valid, time-divisionally turning on N control transistors respectively connected between the gate driving signal output terminal and N rows of pixel circuits so as to transmit the gate driving signal to N rows of pixel circuits time-divisionally;

N is an integer greater than 1 and smaller than or equal to M, and M is a total number of rows of pixel circuits.

20. The gate driving method according to claim 19, wherein, a valid time of the gate driving signal is T;

when the gate driving signal and a $i^{th}$ switch signal controlling a $i^{th}$ control transistor are valid at the same time, the $i^{th}$ control transistor is turned on to transmit the gate driving signal to a $j^{th}$ row of pixel circuits, the $i^{th}$ control transistor is cut off after remaining turned on for T/N to cut off a passage between the gate driving signal output terminal of the shift register unit and the $j^{th}$ row of pixel circuits;

when the gate driving signal and a $i+1^{th}$ switch signal controlling a $i+1^{th}$ control transistor are valid at the same time, the $i+1^{th}$ control transistor is turned on to transmit the gate driving signal to a $j+1^{th}$ row of pixel circuits, the $i+1^{th}$ control transistor is cut off after remaining turned on for T/N to cut off a passage between the gate driving signal output terminal of the shift register unit and the $j+1^{th}$ row of pixel circuits;

the $i^{th}$ switch signal and the $i+1^{th}$ switch signal are clock signals, there is a difference of 360/N° between a phase of the $i^{th}$ switch signal and a phase of the $i+1^{th}$ switch signal, a clock period of the $i^{th}$ switch signal and a clock period of the $i+1^{th}$ switch signal are both equal to the valid time of the gate driving signal;

a sum of time during which the N control transistors are turned on within one clock period is equal to the valid time of the gate driving signal;

i is a positive integer, and $1 \leq i \leq N-1$, j is a positive integer, and $1 \leq j \leq M-1$, M is a total number of rows of the pixel circuits.

* * * * *